United States Patent
Whitaker et al.

(10) Patent No.: US 8,081,010 B1
(45) Date of Patent: Dec. 20, 2011

(54) SELF RESTORING LOGIC

(75) Inventors: Sterling R. Whitaker, Albuquerque, NM (US); Gary K. Maki, Coeur D'Alene, ID (US); Lowell H. Miles, Albuquerque, NM (US)

(73) Assignee: ICS, LLC, McCall, ID (US)

( * ) Notice: Subject to any disclaimer, the term of this patent is extended or adjusted under 35 U.S.C. 154(b) by 0 days.

(21) Appl. No.: 12/954,149

(22) Filed: Nov. 24, 2010

Related U.S. Application Data

(60) Provisional application No. 61/264,172, filed on Nov. 24, 2009.

(51) Int. Cl.
*H03K 19/003* (2006.01)
*H03K 19/007* (2006.01)

(52) U.S. Cl. .......... 326/12; 326/9; 326/11; 326/13; 326/14

(58) Field of Classification Search .......... 326/9–15
See application file for complete search history.

(56) References Cited

U.S. PATENT DOCUMENTS

| | | | |
|---|---|---|---|
| 4,454,589 A | 6/1984 | Miller | 364/716 |
| 4,782,467 A | 11/1988 | Belt et al. | 365/154 |
| 4,783,778 A | 11/1988 | Finch et al. | 370/60 |
| 4,787,057 A | 11/1988 | Hammond | 364/754 |
| 4,797,804 A | 1/1989 | Rockett, Jr. | 365/154 |
| 4,852,060 A | 7/1989 | Rockett, Jr. | 365/154 |
| 4,888,774 A | 12/1989 | Kosuge et al. | 371/38.1 |
| 5,039,876 A | 8/1991 | Hochwald et al. | 307/278 |
| 5,111,429 A | 5/1992 | Whitaker | 365/156 |
| 5,157,625 A | 10/1992 | Barry | 365/154 |
| 5,278,781 A | 1/1994 | Aono et al. | 364/736 |
| 5,307,142 A | 4/1994 | Corbett et al. | 365/156 |
| 5,311,070 A | 5/1994 | Dooley | 307/279 |
| 5,374,894 A | 12/1994 | Fong | 327/14 |
| 5,398,322 A | 3/1995 | Marwood | 395/400 |
| 5,406,513 A | 4/1995 | Canaris et al. | 365/181 |
| 5,436,572 A | 7/1995 | Sugiyama | 326/12 |
| 5,436,865 A | 7/1995 | Kitazawa | 365/194 |
| 5,640,341 A | 6/1997 | Bessot et al. | 365/156 |
| 5,673,407 A | 9/1997 | Poland et al. | 395/375 |
| 5,867,414 A | 2/1999 | Kao | 364/754.02 |
| 5,870,332 A | 2/1999 | Lahey et al. | 365/156 |
| 5,875,152 A | 2/1999 | Liu et al. | 365/233.5 |
| 5,905,290 A | 5/1999 | Houston | 257/380 |
| 5,940,318 A | 8/1999 | Bessot | 365/154 |
| 6,005,797 A | 12/1999 | Porter et al. | 365/156 |
| 6,232,794 B1 | 5/2001 | Cox | 326/81 |

(Continued)

OTHER PUBLICATIONS

Shuler R.L. et al. "Comparison of Dual-Rail and TMR Logic Cost Effectiveness and Suitability for FPGA's with Reconfigurable SEU Tolerance," NSREC, Jul. 2008, 3pgs.

(Continued)

*Primary Examiner* — Shawki S Ismail
*Assistant Examiner* — Thienvu Tran
(74) *Attorney, Agent, or Firm* — Haverstock & Owens LLP

(57) ABSTRACT

Self Restoring Logic (SRL) provides for SEU tolerance in high speed circuits. An SRL cell is designed to be stable in one of two internal states. Upon an SEU event, the SRL cell will not transition between the internal stable states and recover from an SEU. SRL circuits are realized with SRL storage cells driving succeeding SRL storage cells directly or through combinational logic such that the corruption of any one internal state variable in the driving SRL cell and it's the associated combinational output logic can affect at most one internal state variable of the succeeding SRL cell. An SRL circuit does not allow propagation of single SEU faults.

14 Claims, 13 Drawing Sheets

U.S. PATENT DOCUMENTS

| | | | |
|---|---|---|---|
| 6,262,597 B1 | 7/2001 | Bauer et al. | 326/41 |
| 6,326,809 B1 | 12/2001 | Gambles et al. | 326/46 |
| 6,487,134 B2 | 11/2002 | Thoma et al. | 365/205 |
| 6,556,045 B2 | 4/2003 | Cohen | 326/46 |
| 6,573,773 B2 | 6/2003 | Maki et al. | 327/200 |
| 6,583,470 B1 | 6/2003 | Maki et al. | 257/349 |
| 6,597,745 B1 | 7/2003 | Dowling | 375/296 |
| 6,696,873 B2 | 2/2004 | Hazucha et al. | 327/203 |
| 6,725,411 B1 | 4/2004 | Gerlach et al. | 714/755 |
| 6,757,122 B1 | 6/2004 | Kuznetsov et al. | 360/53 |
| 6,791,362 B1* | 9/2004 | Carlson et al. | 326/93 |
| 6,826,090 B1 | 11/2004 | Chu et al. | 365/189.05 |
| 6,826,778 B2 | 11/2004 | Bopardikar et al. | 725/145 |
| 6,895,547 B2 | 5/2005 | Eleftheriou et al. | 714/801 |
| 6,928,602 B2 | 8/2005 | Yamagishi et al. | 714/781 |
| 7,023,235 B2* | 4/2006 | Hoff | 326/10 |
| 7,069,492 B2 | 6/2006 | Piret | 714/762 |
| 7,111,221 B2 | 9/2006 | Birru et al. | 714/755 |
| 7,127,653 B1 | 10/2006 | Gorshe | 714/746 |
| 7,162,684 B2 | 1/2007 | Hocevar | 714/800 |
| 7,482,831 B2* | 1/2009 | Chakraborty et al. | 326/12 |
| 7,489,538 B2 | 2/2009 | Maki | 365/154 |
| 7,958,394 B1* | 6/2011 | Bridgford | 714/25 |
| 2006/0033523 A1* | 2/2006 | Erstad et al. | 326/9 |
| 2009/0189634 A1* | 7/2009 | Rezgui et al. | 326/12 |
| 2010/0026338 A1* | 2/2010 | Fulcomer | 326/11 |

OTHER PUBLICATIONS

Shi, Quan et al., "New Design Techniques for SEU Immune Circuits," NASA Symposium on VLSI Design, Nov. 2000, pp. 7.2.1-7.2.16.

Gambles, Jody W. et al., "Radiation Hardening by Design," International Journal of Electronics, vol. 00, No. 00, Jan. 2006, pp. 1-20.

Massengill, L. et al., "Sub-100nm Radiation-Hardened IC Design" Single-Event Mechanisms Impacting Modeling and Simulation for Design, GOMAC Tech-07, Mar. 2007.

Massengill, L. et al., "Sub-100nm Radiation-Hardened IC Design" Single-Event Mechanisms Impacting Modeling and Simulation for Design, Proceedings of the Government Microcircuit Applications & Critical Technology Conference, Mar. 2007, pp. 309-313.

Whitaker, S. et al. "Ultra Low Power Electronics: Design Observations and CULPRiT Experiences,"Government Microcircuit Applications Critical Technology Conference, Mar. 2007, 4 pgs.

Gambles, Jody, "Radiation Hardness of Ultra Low Power CMOS Microcircuits," Apr. 2003 igambles@cambr.uidaho.edu, Center for Advanced Microelectronic & Bimolecular Research, Univeristy of Idaho, 4 pgs.

Gambles, Jody W. et al.,"Radiation Effects and Hardening Techniques for Spacecraft System Microelectronics," American Institute of Aeronautics and Astronautics, Inc., Jan. 2002, pp. 1-11.

Whitaker, Sterling et al., "Multiple Upset, Radiation Tolerant Combinational Logic Structure," Proceedings of the 16th Single Events Symposium, Apr. 2008, 6 pgs.

Radhakrishnan, Damu et al., "Formal Design Procedures for Pass Transistor Switching Circuits," Apr. 1985 IEEE Journal of Solid-State Circuits, vol. SD-20, No. 2, pp. 531-536.

Hayduk, Robert J. et al., "Ultra-Low Powered Radiation-Tolerant CMOS VLSI," 51st International Astronautical Conference, Oct. 2000, 12 pgs.

Haddad, Nadim et al. "The Path and Challenges to 90nm Radiation Hardened Technology,"Mar. 30, 2008, Hardened Electronics and Radiation Technology, pp. 269-273.

Baze, M.P. et al.,"Angular Dependence of Single Event Sensitivity in Hardened Flip/Flop Designs," IEEE Transactions on Nuclear Science, vol. 55, No. 6, Dec. 2008, pp. 3295-3301.

Calin, T. et al. "Upset Hardened Memory Design for Submicron CMOS Technology," IEEE Transactions on Nuclear Science, vol. 43, No. 6, Dec, 1996, pp. 2874-2878.

Kang, S.M. et al., "CMOS Circuit Design for Prevention of Single Event Upset," 1986 Proc. of 1986 International Conf. on Computer Design, Port Chester, NY, pp. 118158-118160.

Ma, T.P. et al., "Ionizing Radiation Effects in MOS Devices and Circuits," Department of Electrical Engineering, Yale University, New Haven Connecticut and Sandia National Laboratories, Albuquerque, NM, a Wiley-Interscience Publication, John Wiley and Sons, Chapter 9, pp. 484-559.

Wiseman, D. et al. "Test Results for SEU and SEL Immune Memory circuits," 5th NASA Symposium on VLSI Design 1993, NASA Space Engineering Research Center for VLSI System Design, University of New Mexico, 2650 Yale Suite #101, Albuquerque, New Mexico 87106, pp. 2.6.1-2.6.10.

Liu, M. Norley et al., "Low Power SEU Immune CMOS Memory Circuits," IEEE Transaction on Nuclear Science, vol. 39, No. 6 Dec. 1992, NASA Space Engineering Research Center for VLSI System Design, University of Idaho, Moscow, Idaho 83843, pp. 1679-1681.

* cited by examiner

SELF RESTORING LOGIC

RELATED APPLICATIONS

This application claims priority of U.S. provisional application Ser. No. 61/264,172, filed Nov. 24, 2009, and entitled "SELF CORRECTING LOGIC", by these same inventors. This application incorporates U.S. provisional application Ser. No. 61/264,172 in its entirety by reference.

FIELD OF THE INVENTION

The present invention relates to fault tolerant circuits. More particularly, the present invention relates to fault tolerant circuits that utilize self restoring logic.

BACKGROUND OF THE INVENTION

There is a growing need for fault tolerant circuits as integrated circuit (IC) process feature sizes become smaller. Smaller transistor feature sizes carry the advantages of higher speed and greater density, however reduced tolerance to Single Event Upsets (SEUs) due to radiation and possibly other noise sources is becoming a recognized problem. Radiation can have detrimental effects on electronics, including immediate temporary information upset and increased power consumption as a circuit responds to a SEU. Ionizing radiation occurs in the form of charged particles that possess enough energy to break atomic bonds and create electron/hole pairs in the absorbing material. Such particles may include protons, electrons, atomic ions, and photons with energies greater than the material band gaps. The primary ionizing radiation effects on microelectronics can be categorized as either total ionizing dose (TID) effects or transient effects. TID effects are a function of ionizing radiation accumulation over months or even years, which can lead to performance degradation and functional failure. Transient radiation effects are primarily the result of photo-currents generated as energetic particles pass through the circuit. The SEU occurs when the charge collected as a result of the generated photo currents is of sufficient magnitude to alter the logic state of a susceptible node. An upset node may further cause the alteration of the contents of circuit memory elements or alter the operation of the circuit in such a way to cause an error in a logic function. The SEU problem is especially pronounced in space electronics and to a lesser degree in aircraft electronics. As IC process feature sizes continue to decrease in size, it is possible that terrestrial electronic problems will become more evident, especially at higher elevations.

Conventional Radiation Hard By Design (RHBD) electronic technologies are acceptable for feature sizes greater than 200 nm. This RHBD technology has focused mostly on layout issues which partition critical node transistors within latch cells to minimize multiple node SEU effects. However, these same technologies are ineffective at the sub 100 nm process nodes. Linear energy transfer (LET) is a measure of the energy transferred to material as an ionizing particle travels through it. Typically, this measure is used to quantify the effects of ionizing radiation on electronic devices. Recent 90 nm LET values have been reported near 5 with onset values near 0.5. NASA determines that an LET around 40 is acceptable for flight electronics to be essentially immune to single event upsets. LET values less than 5 represent a serious problem for space flight electronics.

Transistor spacing is a serious issue, but there is another problem that has gone unnoticed. Conventional RHBD electronics are limited to speeds less than 500 MHz, regardless of transistor spacing. The fact which determines the final circuit speed is based on the radiation recovery nature of conventional SEU radiation tolerant latches and the data flow between the latches through combinational logic. For example, when a conventional RHBD cell is upset, it is held in a transition state until the particle responsible for the SEU dissipates, which can take a 1 ns or so. After dissipation, a feedback network must activate to force the circuit into a stable state. All of this can take 2 ns or more.

The essential building block of a RHBD circuit is a radiation tolerant storage element, or cell. Conventional RHBD storage electronics tolerate an SEU impact through a cell recovery process where the cell state is restored to the correct value through a network of feedback signals. Such circuits are formally known as asynchronous sequential circuits. Conventional RHBD technology has essentially ignored operational speed and cell recovery because the speed afforded by older fabrication processes is slower than the SEU particle impact and circuit recovery time. For example, a 1 ns SEU recovery time is within delay times associated with elements of a 250 nm circuit design. As a result, designs can essentially wait for the particle effects to dissipate and not suffer a large speed impact. However, a 1 ns delay greatly impacts the operating speeds of modern sub 100 nm processes.

A conventional RHBD SEU tolerant storage cell is achieved through redundancy. Many different cell designs are currently in use, including a SERT cell, a DICE cell, and a Dooley-Berry cell. The SERT cell has advantages over the DICE cell, for example in a SERT cell, no conflicts between PMOS pull down and NMOS pull up circuits can occur during an SEU. Further, good radiation results have been reported with the SERT cell used in numerous chip designs. The operation of the SERT cell, the DICE cell, and the Dooley-Barry cell are described herein to demonstrate problems with SEU events in speed applications.

FIG. 1 illustrates a schematic diagram of an exemplary SERT cell. The SERT cell, or SERT latch cell, is modeled as an asynchronous sequential circuit with two stable states. A stable state is a state that is stable and does not transition unless an external event occurs. An unstable state transitions to another state due to internal feedback. An asynchronous sequential circuit is a finite state machine which provides an output based on the current inputs and past inputs. In other words, such circuits have memory. Memory is achieved through feedback signals known as internal state variables typically depicted with a symbol $y_i$. An asynchronous sequential circuit can be completely defined in terms of a state table. In the example SERT cell shown in FIG. 1, there are four output terminals, or nodes, Y0, Y1, Y2, Y3, and there are four feedbacks from the nodes, which are referred to as y0, y1, y2, y3. An analysis of the SERT cell is illustrated in a state transition table shown in FIG. 2. The inputs for each of the feedbacks y0 and y1 are shown on the horizontal line above the chart. The inputs for each of the feedbacks y2 and y3 are shown in the vertical line to the left of the chart. The resulting state, or next state, for each of the four nodes Y0, Y1, Y2 and Y3, are shown in each corresponding box in the chart. The variables Y0, Y1, Y2, Y3 can assume binary values (0 and 1). An entry of Z in the chart represents a high impedance condition. The stable states (normal operation state) are 0101 and 1010 because at these internal states the SERT cell retains its state at the output nodes. In normal operation, the circuit transitions between these two states.

The next state equations for the SERT cell are defined by:

$$Y0 = y1\,y3(0) + y1'(1)$$

$$Y1 = y0y2(0) + y2'(1)$$

$$Y2 = y1y3(0) + y3'(1)$$

$$Y3 = y0y2(0) + y0'(1) \quad (1)$$

The next state variables are noted as Yi and the present state variables, also referred to as the internal state variables, are noted as yi, as per standard asynchronous sequential circuit terminology. The next state defines the state the circuit will assume and are defined in terms of next state variables. In the case of the SERT cell shown in FIG. 1, the next state variables correspond to the nodes Y0, Y1, Y2, Y3 and the present state variables correspond to the feedback variables y0, y1, y2, y3. A variable can assume binary values (0 and 1) and as logic variables can be represented as uncomplemented or complemented variables. A complemented variable, such as yi' is the inverse of the variable yi. If yi=1, then yi'=0, and vice versa. In general, a pass logic expression Y=A(0)+B(1) means that when A is 1 then a 0 is passed to Y; if B=1, a 1 is passed to Y. As applied to the next state equation (1), the first term on the right hand side of the first equation, y1y3(0), indicates the conditions that will cause Y0 to be driven to the 0 state. In this case Y0 is driven to 0 when both y1 and y3 are high, which corresponds to turning on the two NMOS transistors below node Y0 in FIG. 1 since a NMOS transistor turns on when the gate signal is a logic 1. The second term on the right hand side of the first equation, y1'(1), indicates the conditions that will cause Y0 to be driven to the 1 state. In this case Y0 is driven to 1 when y1 is low, which corresponds to turning on the PMOS transistor above the node Y0 in FIG. 1 since a PMOS transistor turns on when the gate signal is a logic 0. It is impossible to drive Y0 to the 1 and 0 states simultaneously, so node Y0 is free of conflicts. However, if y1 is high and y3 is low then Y0 is not driven and is left in a high impedance state, holding its previous logic level by virtue of the capacitance on this node. The remaining next state equations (1) are similarly interpreted.

Referring to FIG. 2, the cross-hatched and shaded entries denote the stable states. Response to an SEU can be determined from the state transition table. For example, suppose the circuit is in state 0101 and an SEU affects state variable Y2 forcing this node to transition from a 0 to 1 (upset the PMOS device above node Y2). As a result, the circuit enters state 0111 which corresponds to a next state entry of 0Z01, as shown in FIG. 2. In response, the next state action of the circuit drives only Y2 back to a 0, leaving all other state variables at the same value, such that as soon as the SEU event dissipates, the circuit returns to the state 0101, illustrating correct SEU tolerant action. Detailed transition discussions and background information are described in the paper titled "Radiation Hardening by Design" by Gambles et al.

It is possible for the SERT cell to enter numerous states as a result of an SEU. For example, if the SERT cell is in state 0101 and an error occurs on Y3 (state transitions from 1 to 0), this forces the SERT cell to state 0100. As shown in FIG. 2, the state 0100 has a next state entry Z111. With a present state y0=0 and next state=Z, no state change on Y0 is being forced, hence y0 will remain 0. Y1 and y1 are both 1, so there is no change in y1 which will remain 1. With y2=0 and Y2=1, y2 will assume 1. Since Y3 is upset to a 1 from the present state y3=0 by the SEU (assuming the electronics is faster than the time for the SEU to dissipate). Accordingly, with the next state entry Z111, the next state will be 0110. The state 0110 has a next state entry of ZZ11. The SERT cell remains in next state 0110 until the SEU dissipates (state of Y3 returns to 1) after which the SERT cell transitions to state 0111 and then immediately returns to stable state 0101. The recovery time from an SEU requires three circuit transitions, the transition from the state 0100 after the initial SEU event to the next state 0110, the transition from the next state 0110 to the state 0111 after the SEU dissipates, and the transition from the state 0111 to the stable state 0101. The recovery time is determined by the switching time of the electronics and the time for the SEU to dissipate. The table in FIG. 3 includes the same values as in FIG. 2 and the table identifies all the states the circuit can assume as a result of an SEU event. The cross-hatched states denote intermediate states associated with an initial stable state 0101 and the shaded states denote intermediate states associated with an initial state 1010. These same states are the states which the circuit can assume in recovering from an SEU, referred to as transient transition path states. The cross-hatched states in FIG. 3 are the transient transition states corresponding to the initial stable state 0101. The shaded states in FIG. 3 are the transient transition states corresponding to the initial stable state 1010.

As previously indicated, conventional RHBD electronics are speed limited. The speed limitation problem and conventional solution are further described below in the context of the SERT cell. A similar discussion can be applied to other types of cells used in conventional RHBD electronics, such as the DICE cell or the Dooley-Barry cell which are described below. Let the SERT cell have two outputs, Q1 and Q2. In the SERT cell, it is assumed the circuit is in a stable state (in this case either 0101 or 1010 as shown in FIG. 2) to produce a correct output. False data can be clocked out of the SERT cell if the circuit is in an SEU recovery transition state. Suppose y3 and y2 form the SERT cell outputs Q1=y3 and Q2=y2. If the stable state is 0101 and an SEU event occurs forcing the circuit momentarily into state 0100, as in the previous example, then the output Q1 (y3) and the output Q2 (y2) assume false values as the circuit recovers along the transient transition states, the cross-hatched states in FIG. 3. FIG. 4 illustrates the false output values Q1 and Q2 that can propagate if the circuit output is clocked during recovery. If a data latching clock pulse occurs between the dotted lines, a false value can be output. As shown in FIG. 4, the correct value of Q1 should be 1 and Q2 should be 0. One or both outputs are in error between the dotted lines. An output clocked into the next stage would have a false value. It is necessary for the circuit to "recover" which takes time. Clocking too fast produces false outputs. To be correct, clocking has to be slowed, which is a speed limiting problem. The conventional solution to this speed limiting problem assumes the circuit has fully recovered from an SEU event, which is a function of the time for the SEU to dissipate. A 1 ns SEU event can produce many false output values for a 1 GHz clock. While the SERT cell is used to illustrate problems with conventional RHBD circuits, these same problems exist with the other RHBD cells, including the popular DICE cell. The DICE cell has additional design problems relative to proper sizing of transistors over all the process corners and appears to not have the same degree of tolerance as the SERT cell. Moreover, LET problems have been shown for the DICE cell at the 90 nm node. Regardless, the speed problem exists.

Following is a discussion of other self recovering latches, namely the DICE cell and the Dooley-Barry cell. FIG. 5 illustrates a schematic diagram of an exemplary Dooley-Barry cell. The Dooley-Barry cell, or Dooley-Barry latch cell, is modeled as an asynchronous sequential circuit with two stable states. The state transition table for the Dooley-Barry cell is shown in FIG. 6. The stable states for the Dooley-Barry cell are 0101 and 1010. The next state entries are assigned such that every state adjacent to the stable state has the same next state entry as the stable state. In FIG. 6, the cross-hatched states are the transient transitions to the stable state 0101, and the shaded states are the transient transitions to the stable state 1010 such that when an SEU forces one state variable to transition, the circuit returns to the stable state.

In another configuration of a conventional fault tolerant circuit, the DICE cell is used for the self recovering latch. FIG. 7 illustrates a schematic diagram of an exemplary DICE cell. The DICE cell, or DICE latch cell, is modeled as an asynchronous sequential circuit with two stable states. The state transition table for the DICE cell is shown in FIG. 8. The stable states for the DICE cell are 0101 and 1010. It is assumed that all conflicts between NMOS and PMOS are resolved to 0. For example, the NMOS pull down is stronger than the PMOS pull up. The state transition table would be different if the conflicts resolve differently. Under the assumed condition, the cross-hatched states shown in FIG. 8 are SEU transient transition states associated with the stable state 0101, and the shaded states are SEU transient transition states associated with the stable state 1010.

SUMMARY OF THE INVENTION

Embodiments of the present invention are directed to circuit design configurations known as Self Restoring Logic (SRL) that provide for SEU tolerance in high speed circuits. An SRL cell is designed to be stable in one of two internal states. Upon an SEU event, the SRL cell will not transition between the stable internal states. SRL circuits are realized with SRL latch cells driving succeeding SRL latch cells directly or through combinational logic such that the corruption of any one internal state variable in the driving SRL cell and it's the associated combinational output logic can affect at most one internal state variable of the succeeding SRL cell. There are three embodiments of SRL cells described herein. A first embodiment is a configuration of CMOS transistors that possesses the above properties that implement an asynchronous sequential circuit with three internal state variables plus two inverters. This embodiment is comprised of six PMOS transistors interconnected with six NMOS transistors to implement the specified asynchronous sequential circuit; two additional PMOS and two additional NMOS transistors form two internal inverters in the SRL cell. A second embodiment is a configuration of CMOS transistors that possesses the above properties that implement an asynchronous sequential circuit with three internal state variables plus three inverters. This embodiment is comprised of six PMOS transistors interconnected with six NMOS transistors to implement the specified asynchronous sequential circuit; three additional PMOS and three additional NMOS transistors form three internal inverters in the SRL cell. A third embodiment consists of using an established self-restoring latch, such as the DICE cell, and transmitting at least three internal state variables to succeeding cells.

In one aspect, SRL comprises a network of cells which include data storage cells and combinational logic configured to tolerate transient and solid faults comprised of the following elements:

a. Data storage cells with the property to internally self recover from transient faults.
b. Each data storage cell produces at least three outputs with the property that at most one output can be in error due to a fault.
c. Each data storage cell output drives independent combinational logic circuits such that at most only one combinational logic output is in error.
d. Each data storage cell accepts three signals of which a maximum of one is in error.
e. Each data storage cell automatically corrects a single error input.
f. The interconnection of elements is defined as follows: Let one or more data storage cells i each function as a data source and let data storage cell j function as a data sink. (For example, to add two numbers A and B and put the result in C, there are two data sources and one data sink.)
  i. A combinational logic circuit for each state variable yk of the data storage cells, where k=1, 2, . . . n. Data is input to the combinational logic circuit from source data storage cell i and outputs data to sink data storage cell j.
  ii. For each state variable yk in sink data storage cell j, the combinational logic is derived only from one state variable yk in one or more source data storage cells i and presented as input to sink data storage cell j.
  iii. At most one combinational logic circuit can suffer from a fault.
g. The data storage cell which receives n input signals from n combinational logic circuits is able to transition to the correct stable state when at most one input signal presents a false value due to a transient fault, where each combinational logic circuit drives state variable nodes k, k=1, . . . , n.

The data storage cell posses the following properties:
An asynchronous sequential circuit that models the behavior of the circuit.
A minimum of three state variables required in the asynchronous sequential circuit model.
A minimum of three state variable modules, each that implement a state variable in an asynchronous sequential circuit model of the data storage cell.
The state variable modules are configured such that at most one state variable module is susceptible to a single fault condition at a time.
When the state variable module of one state variable is affected by a fault, the unaffected state variable modules activate circuits to restore the affected variable to the correct value; state variable modules unaffected by the fault are prevented from transitioning further.

The data storage cell has the following additional properties:
Each state variable module consists of a plurality of PMOS transistors which when active drive the corresponding state variable to the high (logic 1) state, and a plurality of NMOS transistors which when active drive the corresponding state variable to the low (logic 0) state.
Stable states for the state variable modules are 000 and 111 in one embodiment and 010 and 101 in another embodiment.
In a non-fault environment, either the PMOS or NMOS transistors are active to drive the state variables to the high or low state, depending on the stable state.
Let the state variable modules be noted as $y_i$, $i=1, 2, 3$. If a fault affects $y_i$, feedback from $y_j$, $j \neq i$, forces $y_i$ to return to the correct state. Moreover, feedback within the circuit forces $y_j$, $j \neq i$, into the high impedance state.

Each data storage cell includes state variable modules. Each state variable module implements a state variable in a defining state table. By the instantiation of a separate clock line for each state variable module, the circuit tolerates faults in the clock system.

The nature, principle and utility of the present invention will become more apparent from the following detailed description when read in conjunction with the accompanying drawings.

DETAILED DESCRIPTION OF THE EMBODIMENTS

Embodiments of the present application are directed to a fault tolerant circuit. Those of ordinary skill in the art will realize that the following detailed description of the fault tolerant circuit is illustrative only and is not intended to be in any way limiting. Other embodiments of the fault tolerant circuit will readily suggest themselves to such skilled persons having the benefit of this disclosure.

Reference will now be made in detail to implementations of the fault tolerant circuit as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions will likely be made in order to achieve the developer's specific goals, such as compliance with application and business related constraints, and that these specific goals can vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of a fault tolerant circuit are configured to tolerate SEUs for high speed operation by producing a correct output even while the circuit is recovering. The fault tolerant circuit produces the correct output using a self restoring logic approach.

Self Restoring Logic (SRL) achieves fault tolerance in a different manner than the fault tolerant circuits using conventional RHBD cells as described above. Understanding the fundamental problem is key to finding a new solution. From the previous discussion, it has been demonstrated that partitioning the critical nodes within a SERT or DICE design does nothing to impact the speed problem because the problem is one of cell recovery, not transistor spacing. If the latch data is output while the circuit is recovering from an SEU, then false data can be propagated. This problem is layout independent.

The speed limitation problem can be solved with an entirely new paradigm. Digital processing must continue even while the storage cell is experiencing an SEU or the combinational logic is experiencing an SEU. In legacy SEU tolerant electronics, the circuits "wait" for the cells to recover; this cannot be tolerated in sub 100 nm electronics. Full Triple Modular Redundancy (TMR) can be used to implement full fault tolerance. However, triple voting circuits are needed at each stage along with three storage cells when using TMR. SRL is introduced where only one storage cell is needed with no voting circuits.

Figure 9:
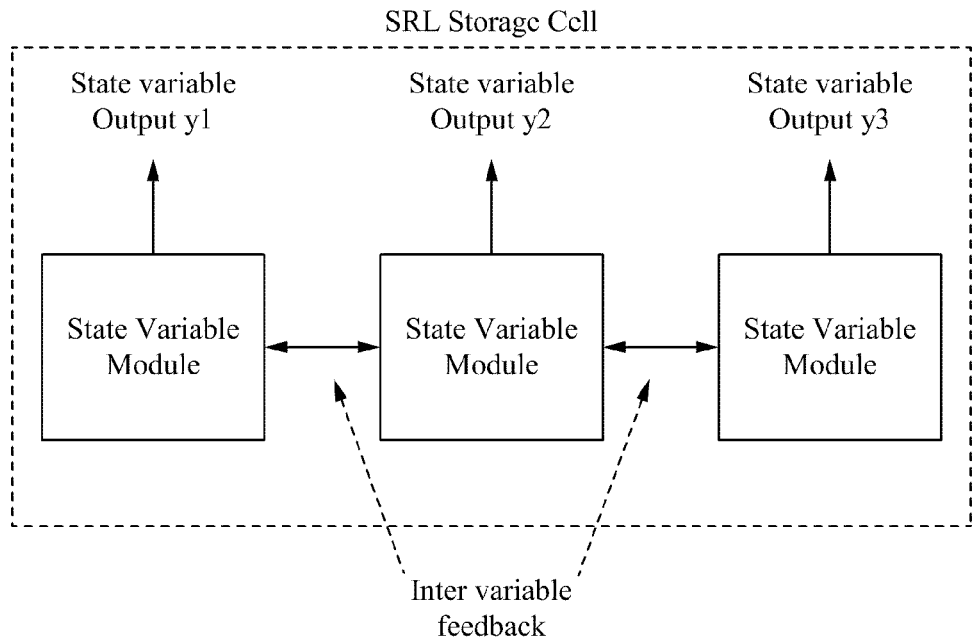
FIG. 9 illustrates a functional block diagram of a data storage cell, or latch, according to an embodiment.
Figure 11:
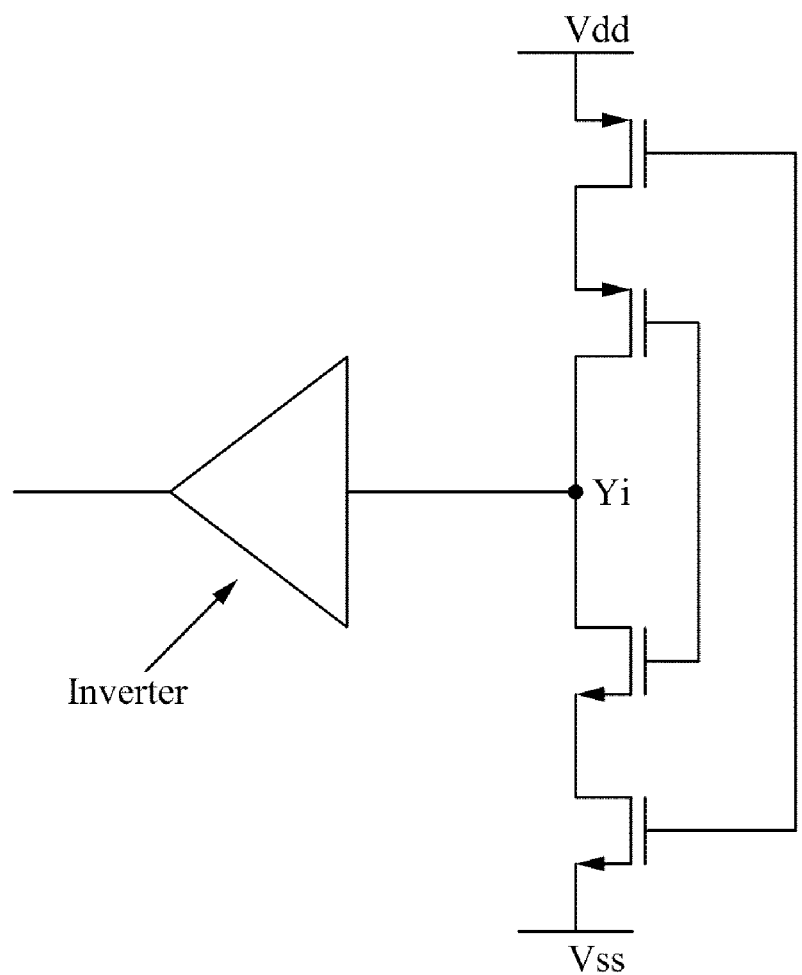
FIG. 11 illustrates an exemplary schematic diagram of a state variable module.

FIG. 9 illustrates a functional block diagram of a SRL storage cell, or latch, according to an embodiment. In this embodiment, the SRL storage cell includes three state variable modules. Each state variable module implements a state variable in the defining state transition table. In some embodiments, the stable states are 000 and 111, as shown in the state transition table of FIG. 19. In other embodiments, the stable states are 010 and 101, as shown in the state transition table of FIG. 17. It is understood that a state transition table can be designed with alternative stable states. The SRL storage cell shown in FIG. 9 has three state variable modules. In alternative embodiments, each SRL storage cell has four state variable modules. Moreover, there is one output per state variable module. In some embodiments, each state variable module includes two PMOS transistors and two NMOS transistors along with an inverter as depicted in FIG. 11; the inverter may or may not be needed in all state variable modules.

Upon an occurrence of a fault (SEU), the SRL storage cell performs self restoration to the previous state before the fault. Internal state variable feedback between the state variable modules performs the following action. In normal operation when no fault is present, each state Yi is driven to remain in a stable state, such as the stable states Y0Y1Y2=000 and 111, or Y0Y1Y2=010 or 101. Upon the presence of a fault in Y1 for example, the feedback is such that Y1 is energized to return to the correct state. In addition, the feedback places Y2 and Y3 into a condition where Y2 and Y3 cannot change state; this is accomplished by putting both Y2 and Y3 in a high impedance condition so they cannot transition. When the fault dissipates, then Y1 being energized to return, will assume the correct value upon which Y2 and Y3 exit the high impedance state. The circuit tolerates the fault, self restores and at most only one state variable produces a faulty state while the SEU is present. Such performance is seen in the state transition tables of FIGS. 17 and 19, which are described in detail below.

Figure 10:
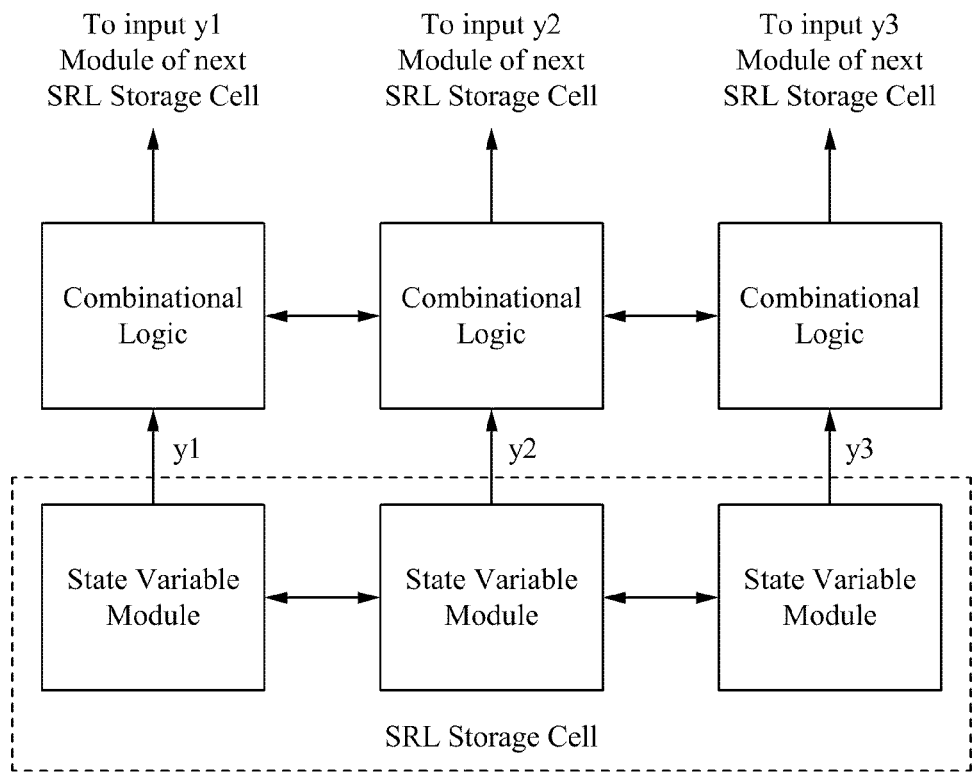
FIG. 10 illustrates the interaction between the data storage cell of FIG. 9 and combinational logic.

FIG. 10 illustrates the conceptual interaction between the SRL storage cell of FIG. 9 and combinational logic. There is a separate combinational logic cell associated with each state variable module. The combinational logic between two SRL storage cells performs a function such as addition or some other operation between data in the two SRL storage cells. The logic to implement the next state equations for Y1, Y2, Y3 is embedded in the feedback and transistors that make up each Yi. In other words the "logic" that implements the next state equations for Y1, Y2, Y3 is embedded in the state variable modules and the feedback. Since each state variable produces equivalent information, the output from each combinational logic cell produces an equivalent result. The output from the combinational logic cell for Yi of one SRL storage cell will drive Yi of the successor SRL storage cell. Since a combinational logic cell has only one output, at most one output from the combinational logic cell is in error, and as such the successor SRL storage cell will be initialized to either a normal (unfaulted) state or a state where at most one state variable is in error. In the later case where one state variable error is passed to the successive SRL storage cell, the successive SRL storage cell will repeat the action defined above and restore itself to the correct state immediately since there is no SEU present to keep the successive SRL storage cell in an error state. This action demonstrates that a fault condition cannot propagate.

As shown in FIG. 10, there are at least three state variable modules within a SRL storage cell. In some embodiments, one clock is employed to drive all state variable modules. However, a single clock becomes a common mode failure point. A clock failure is indistinguishable from a failure within a state variable module or the associated combinational logic. If instead a separate clock is used for each state variable module, then the failure of one clock line is tolerated and is viewed as essentially a failure in any single state variable module or combinational logic network and therefore such a design tolerates faults on the clock line also.

Figure 12:
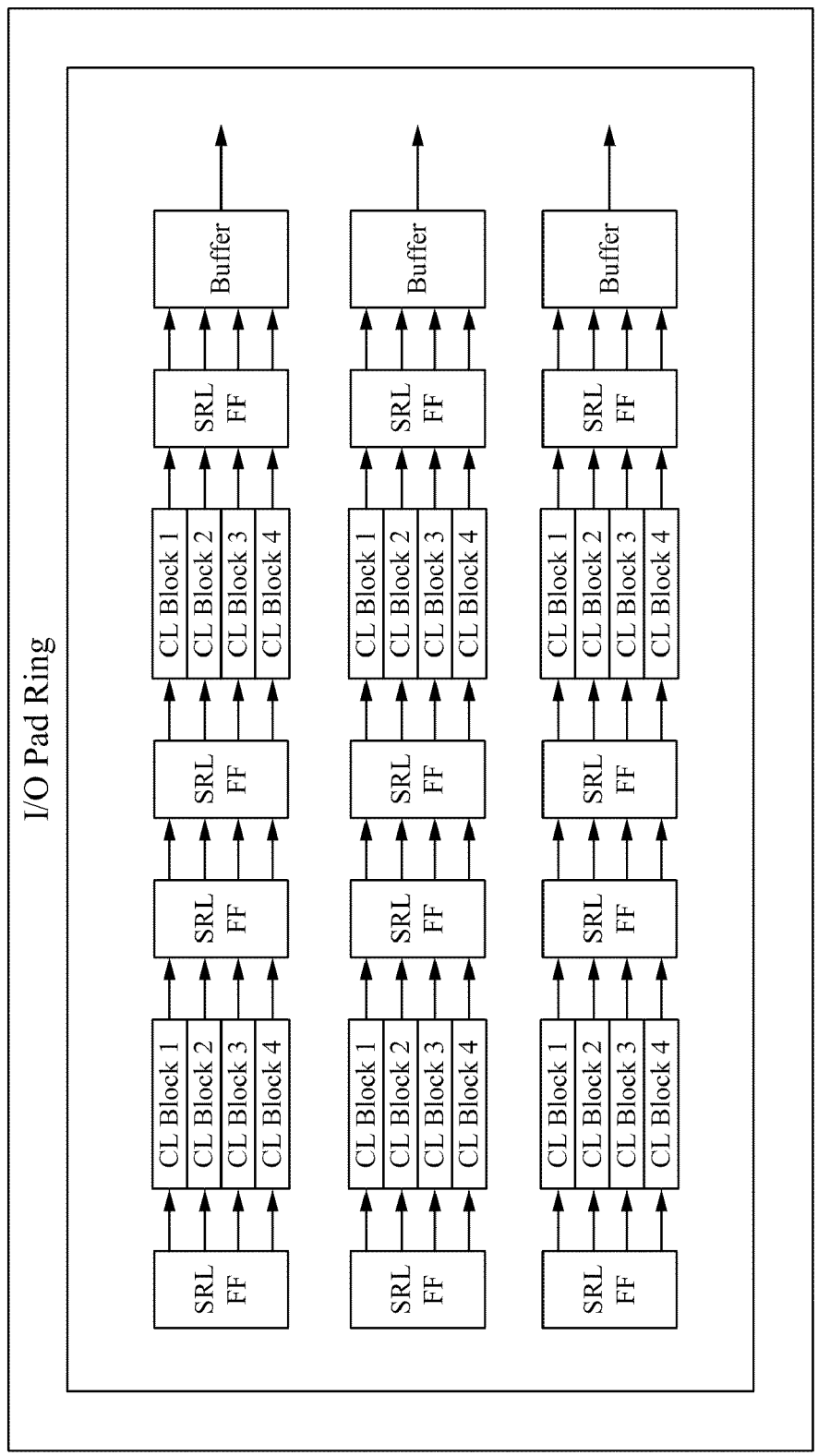
FIG. 12 illustrates conceptual block diagram of a four signal version of a Self Restoring Logic (SRL).
Figure 13:
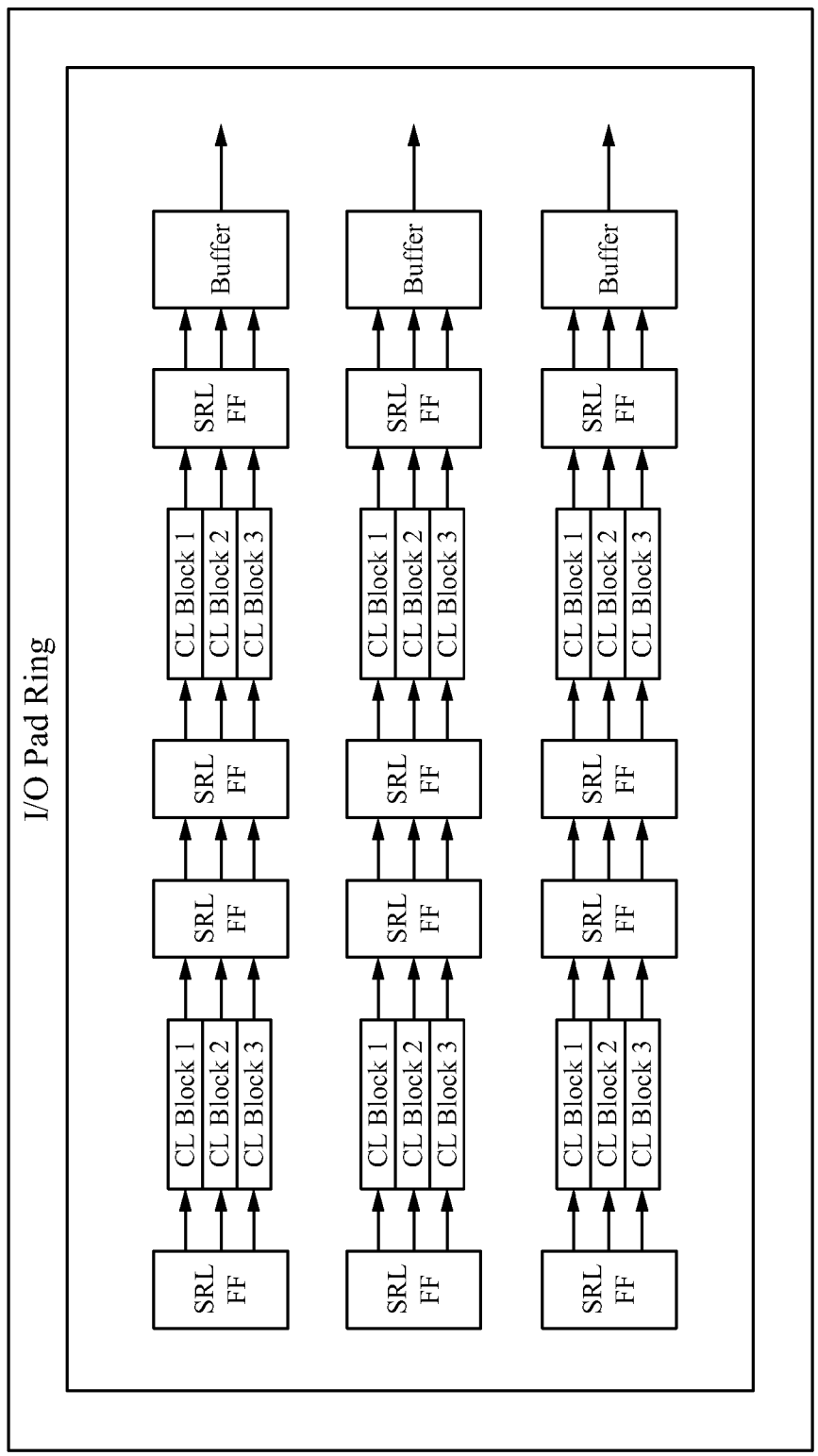
FIG. 13 illustrates conceptual block diagram of a three signal version of a Self Restoring Logic (SRL).

FIGS. 12 and 13 illustrate conceptual block diagrams of the Self Restoring Logic (SRL). SRL circuits are realized with SRL cells, or SRL latch cells, driving succeeding SRL cells directly or through combinational logic such that the corruption of any one internal variable in the driving SRL cell and the associated combinational output logic of the driving cell can affect at most one internal state variable of the succeeding SRL cell. External data normally is obtained from signals external to a chip and presented to a first stage logic. A logic stage is considered to be an array of SRL cells to form a register coupled to a second set of SRL cells forming a second register, and in some cases combinational logic coupled between the two registers. The first stage logic represents the first set of registers into which external data would be stored. From a conceptual standpoint, suppose a chip performs A+B=C, where numbers (b bits) are input to a chip. Numbers A and B will be input to SRL cells, each b bits long. Numbers A and B will go through combinational logic to perform addition and end up in register C. The first stage logic would be the registers that hold A and B.

Computations or logic operations are performed between logic stages with new information presented to succeeding SRL cells. Configuration of SRL logic normally forms internal data registers or control states within a chip. Such can be realized as a pipeline as depicted in FIGS. 12 and 13, or can be fed back so as to reuse a single logic stage. Internal state variables from each stage are presented to succeeding stages either directly or through combinational logic in such a manner that only one internal state variable in a succeeding stage can be corrupted. For example, let Si represents the state of an initial SRL cell and Sj represents the state of the successor cell, where Si and Sj are in turn denoted by internal state variables (y0, y1, y2 ... ).

FIG. 12 shows a four signal version where four signals, representing four internal state variables, are passed between SRL cells. FIG. 13 shows a three signal version. State variable yi of the driving stage affects only yi of the succeeding stage. Let the driving stage i have state variables y0i y1i y2i and the succeeding stage j have state variables y0j y1j y2j. State variable y0i only affects y0j; y1i only affects y1j and y2i only affects y2j. Moreover, the combinational logic that forms each next state variable Y0j, Y1j, Y2j is separate, as depicted in FIGS. 12 and 13. Therefore, since at most only one variable (y0i, y1i, y2i) can be affected by an SEU, and the combinational logic is not shared resulting in at most one combinational logic block being affected, only one state variable y0j, y1j, y2j would be affected by an SEU.

The three signal version has latches that require more transistors. An SEU event can affect combinational logic as well as state variable modules. The output of either can momentarily be in error. Therefore, for self correction three or more signal representations are needed. Three or more combinational logic signals are passed between the SRL cells, also referred to as a SRL flip-flop (FF) storage cells. A FF consists of two latches, a master and a slave. In some embodiments, the FF can be composed of a normal non-fault tolerant latch followed by an SRL cell. Key design features for the SRL cell includes the capabilities to a) accept and respond to three or more inputs, b) correct at most one input in error of the inputs to insure the correct response, c) not allow an SEU error to propagate, and d) recover from a SEU event and not enter a permanent error state. The SRL cell essentially absorbs a false signal if one of the three or more inputs is in error and outputs a correct set of signals. Correct signal values are propagated to succeeding modules even while the SRL cell or a combinational logic block is recovering from an SEU. Since it is not necessary to wait for the SEU event to dissipate, full advantage of the process speed is achieved.

The SERT cell meets the criteria for a SRL latch storage cell. It is necessary to transmit either three or four state variables to the next SRL cell. In the four signal model, all state variables (y0, y1, y2, and y3) feed into the next SRL cell, directly or through separate combinational logic. In the three signal model, any three of the four state variables can feed the next SRL cell. The SRL operates as follows: If a false SRL cell input signal is present, the next SRL cell will enter a state adjacent to a stable state which tolerates the false signal since the circuit is in an associated transient transition state. Consider again a driving SRL cell i and a succeeding SRL cell j. For example, if the state variable Y3i assumes a false value, due to an SEU, when the circuit is in 0101 in SRL cell i, thereby changing the circuit to 0100 in the SRL cell i, then state 0100 in SRL cell i, causes SRL cell j to enter state 0100, which due to the feedback action, immediately forces the circuit back to state 0101 in SRL cell j. Notice the SEU has not impacted SRL cell j to allow the SEU to propagate; further after the SEU dissipates, SRL cell i returns to the correct state 0101. The succeeding SRL cell, the SRL cell j, self corrects and the fault is not propagated. When the SEU dissipates in an affected storage cell, it too will self correct after the SEU dissipates.

Figure 14:
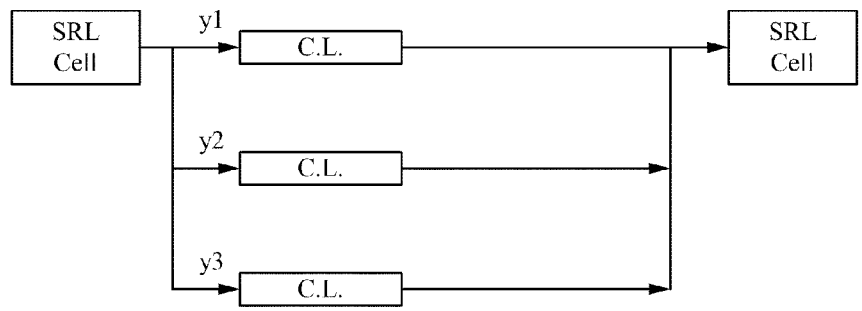
FIG. 14 illustrates an exemplary configuration of a stage using an SRL FF storage cell, replicated combinational logic, and another SRL FF storage cell.

A disadvantage with this approach is a replication of the combinational logic. FIG. 14 illustrates an exemplary configuration of a stage using an SRL storage cell, replicated combinational logic, and another SRL storage cell. The stage shown in FIG. 14 is the same as one of the SRL-combinational logic stages in FIG. 13. Of note in FIG. 14, only a single SRL storage cell is needed as the input to the combinational logic blocks, and no voter circuitry is needed.

Figure 15:
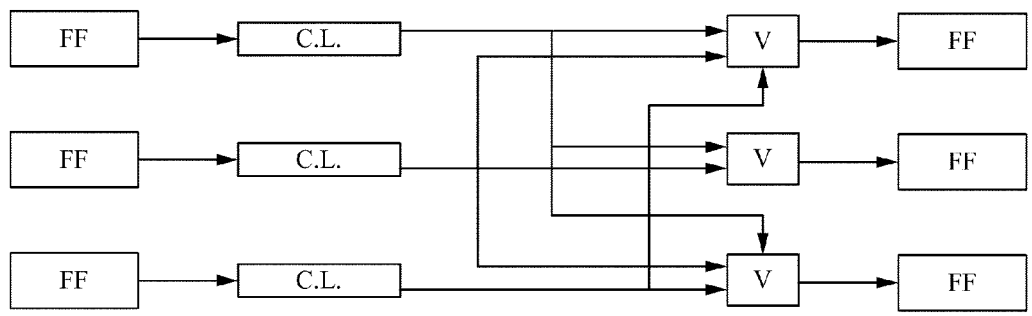
FIG. 15 illustrates an exemplary configuration of a stage using Triple Modular Redundancy (TMR).

An alternative to achieve fault tolerance is full Triple Modular Redundancy (TMR). TMR is depicted in FIG. 15 where multiple voter circuits are needed to accomplish the goal accomplished using the SRL approach as in FIGS. 12-14. A single voter is insufficient in the circuit of FIG. 15 because an SEU impact on the voter circuit can result in incorrect data. The FF cells in FIG. 15 need not be SEU immune but must be refreshed (e.g. have data written) often to not allow an error to remain within a FF cell in the event the FF cell does not recover to the correct state after the SEU dissipates. In contrast to the TMR circuit, the SRL approach self recovers and performs voting functions within a single cell.

Figures 1, 2:
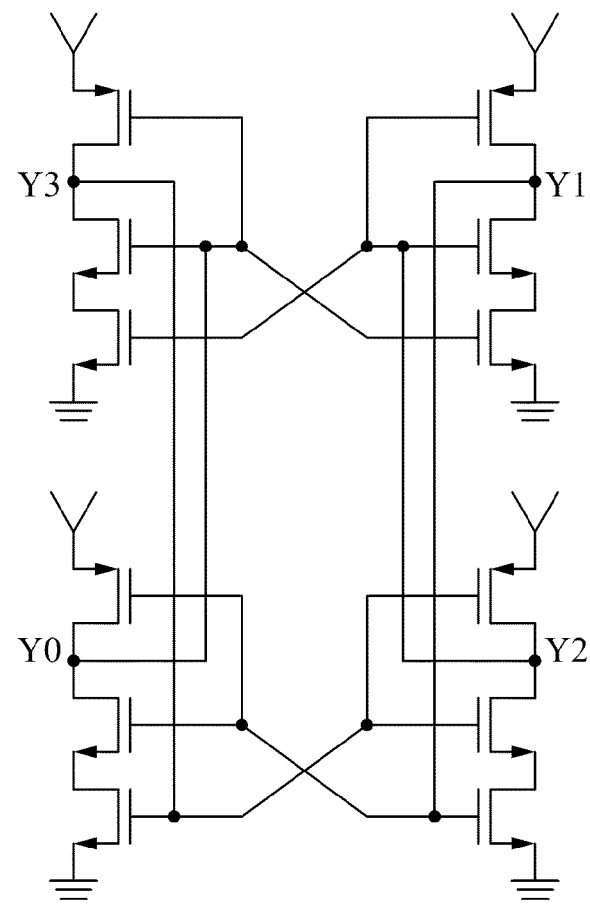
FIG. 1 illustrates a schematic diagram of an exemplary SERT cell.
FIG. 2 illustrates a state transition table for the SERT cell of FIG. 1.
Figures 3, 4:
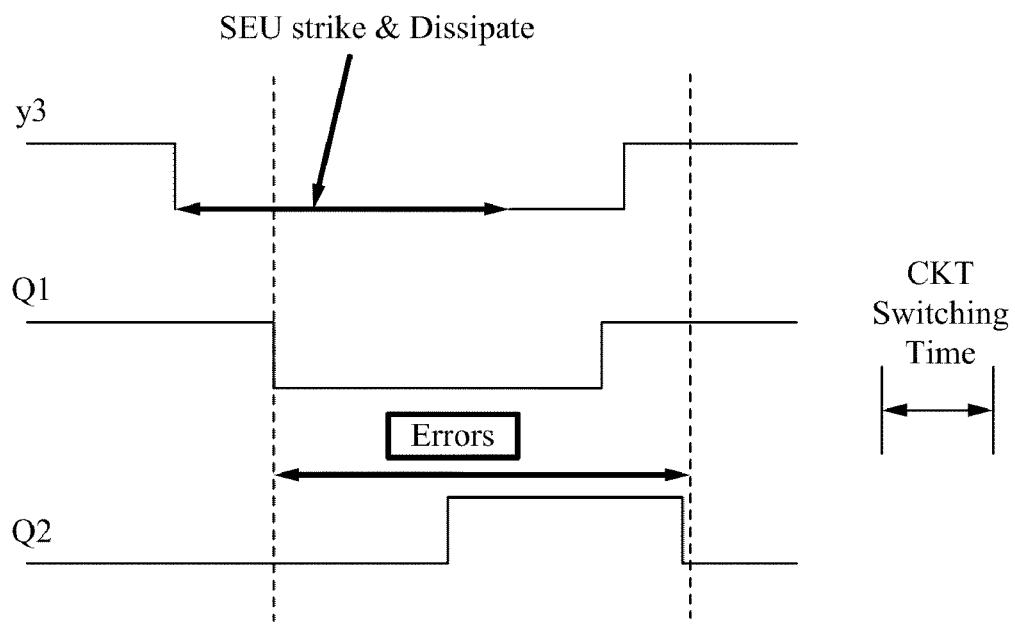
FIG. 3 identifies all the states the circuit of FIG. 1 can assume as a result of an SEU event.
FIG. 4 illustrates the false output values Q1 and Q2 that can propagate if the circuit output is clocked during recovery.
Figure 5:
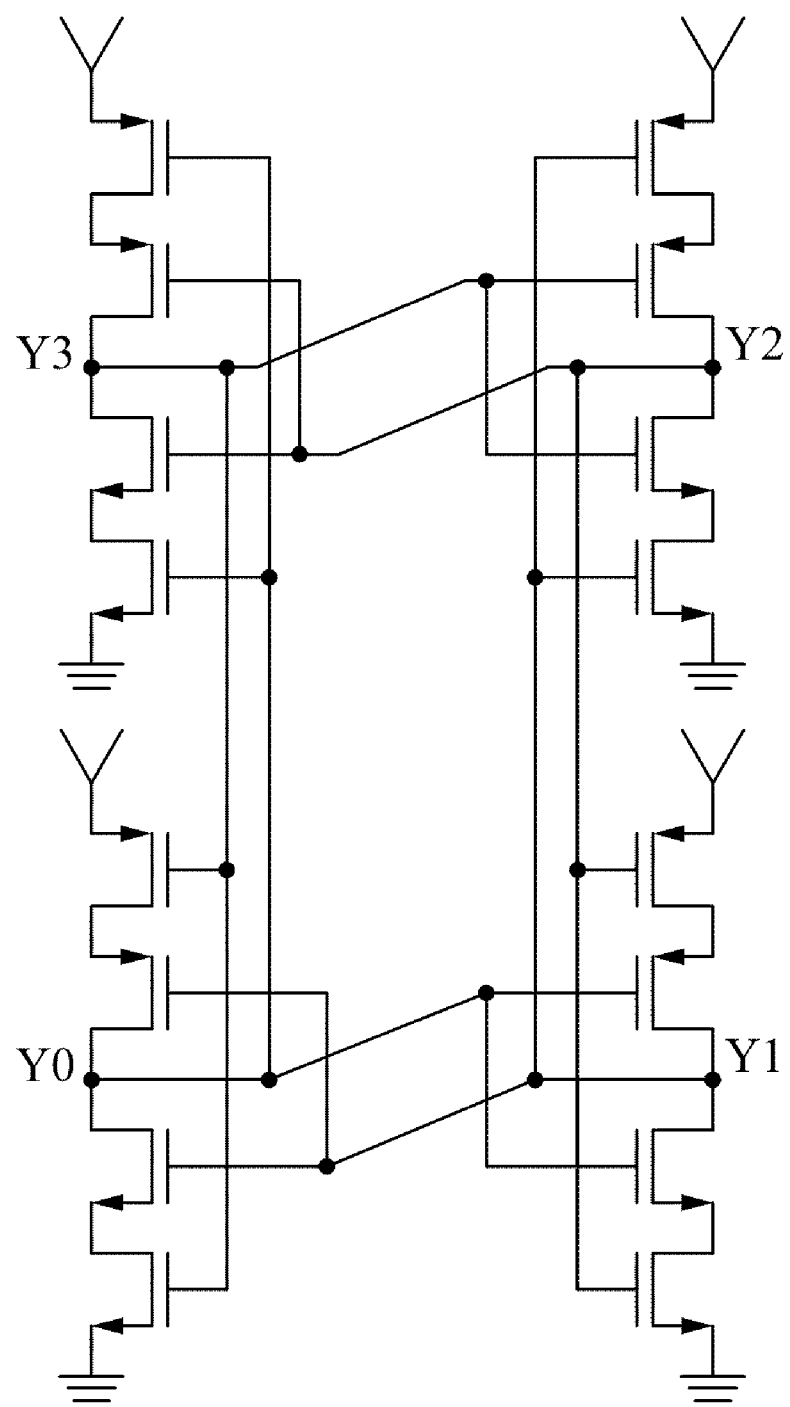
FIG. 5 illustrates a schematic diagram of an exemplary Dooley-Barry cell.
Figures 6, 7, 8:
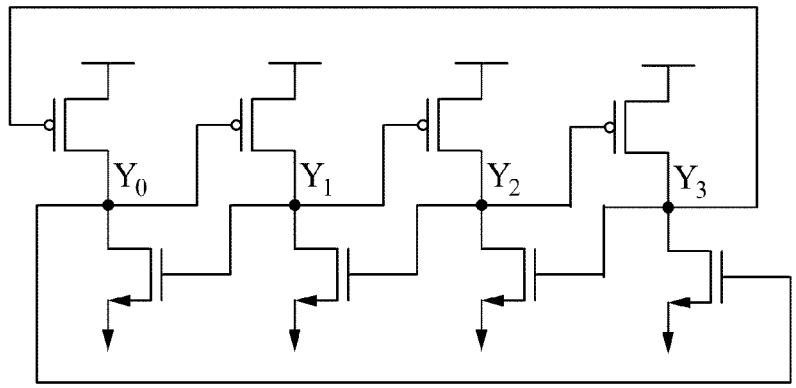
FIG. 6 illustrates a state transition table for the Dooley-Barry cell of FIG. 5.
FIG. 7 illustrates a schematic diagram of an exemplary DICE cell.
FIG. 8 illustrates a state transition table for the DICE cell of FIG. 7.

In alternative embodiments, the SRL can be implemented using DICE or Dooley-Barry cells applying the same principles described above in regard to the SERT cell. Each SRL storage cell, implemented as either a SERT cell, a DICE cell, or a Dooley-Barry cell, returns to the stable state after an SEU event. If one input signal is false, the inputs to the SRL circuit force the SRL storage cell to enter a transient transition state adjacent to the stable state (cross-hatched states or shaded states in FIG. 3, 6, or 8), and immediately is corrected.

The natural use of the SERT cells, DICE cells, or Dooley-Barry cells requires the transmission of four internal state variables between successive cells. When applied to the SRL circuit that includes combinational logic, this requires four copies of combinational logic, one combinational logic coupled to receive one internal state variable output from the preceding SRL cell. In alternative embodiments, the use of SRL storage cells composed of three internal state variables requires only three copies of combinational logic. Following are two three-variable designs of self restoring storage cells.

Figure 16:
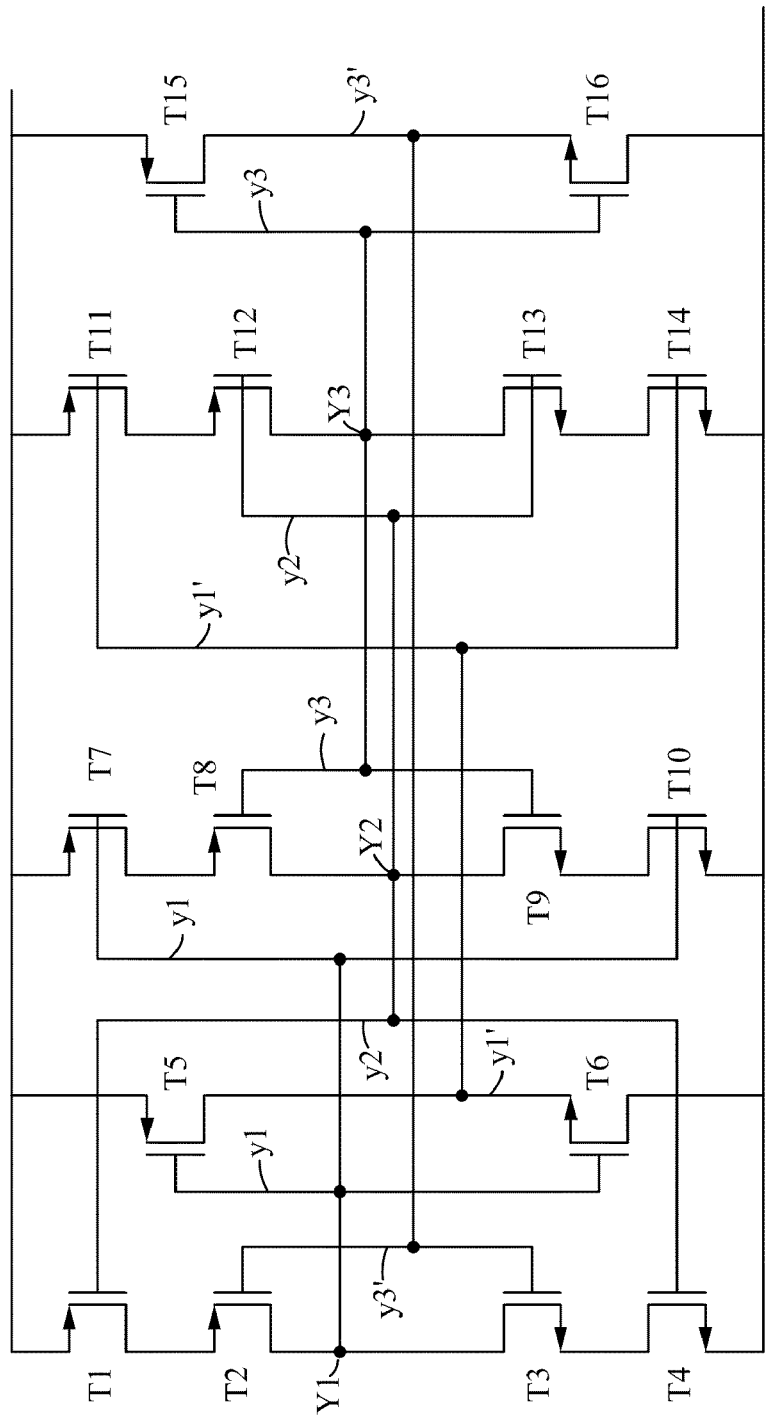
FIG. 16 illustrates a schematic diagram of an exemplary first SRL latch cell according to a first design.

Design 1:

FIG. 16 illustrates a schematic diagram of an exemplary first SRL storage cell according to a first design. As shown in FIG. 16, Yi is the next state of yi. The value on Yi will be assumed by yi as soon as the circuit operation is stable, no more transistor switching. As applied to the circuit of FIG. 16, the next state variable Y1 is measured at node Y1. The internal state variable y1 is input to the gates of both the PMOS transistor T5 and the NMOS transistor T6, which are commonly connected to the node Y1. The inverter formed from the PMOS transistor T5 and the NMOS transistor T6 generates the compliment internal state variable y1' of the internal state variable y1. The internal state variable y1' is input to the gates of the PMOS transistor T11 and the NMOS transistor T14. The internal state variable y1 is also input to the gates of the PMOS transistor T7 and the NMOS transistor T10. The next state variable Y2 is measured at node Y2. The internal state variable y2 is input to the gates of the PMOS transistors T1 and T12 and the NMOS transistors T4 and T13, which are commonly connected to the node Y2. In this design, it is not necessary to generate y2'. When y2' appears in the next state equations (5) below, the logic 1 is generated through the appropriate PMOS transistor which requires the signal y2 in this case. The next state variable Y3 is measured at node Y3. The internal state variable y3 is input to the gates of the PMOS transistor T8 and NMOS transistor T9. The internal state variable y3 is also input to the gates of both the PMOS transistor T15 and the NMOS transistor T16, which are commonly connected to the node Y3. The inverter formed from the PMOS transistor T15 and the NMOS transistor T16 generates the compliment internal state variable y3' of the internal state variable y3. The internal state variable y3' is input to the gates of the PMOS transistor T2 and the NMOS transistor T3.

Figure 17:
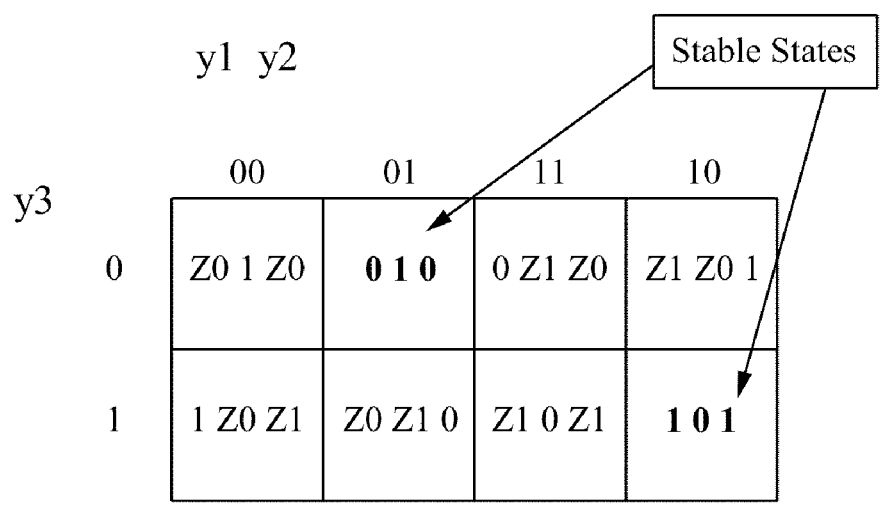
FIG. 17 illustrates a state transition table for the first SRL latch cell of FIG. 16.

The state transition table for the first SRL storage cell of FIG. 16 is shown in FIG. 17. FIG. 17 shows the state table for the first SRL storage cell where states 010 and 101 are the stable states. The entries in the state transition table have the following meaning for next state variable Yi:

A "0" entry means Yi is forced to 0 preferably through NMOS devices.

A "1" entry means Yi is forced to 1 preferably through PMOS devices.

A "Z0" entry can be a high impedance state for Yi, or can be forced to 0; in other words Z0 is considered to be a logic don't care for 0 values.

A "Z1" entry can be a high impedance state for Yi, or can be forced to 1; in other words Z1 is considered to be a logic don't care for 1 values.

The minimal-sum-of-products pass logic expressions for the next state equations to realize the storage cell of FIG. 16 are:

$$Y1 = y2y3'(0) + y2'y3(1)$$

$$Y2 = y1y3(0) + y1'y3'(1)$$

$$Y3 = y1'y2(0) + y1y2'(1) \tag{5}$$

Consider the next state equation for state variable Y1, where $Y1 = y2y3'(0) + y2'y3(1)$. To generate 0 for Y1, it is necessary for y2 to drive the gate of the NMOS transistor T4 and y3' to drive the gate of the NMOS transistor T3. The inverter consisting of transistors T15 and T16 is needed to generate y3', but an inverter is not needed to generate y2'. To generate 1 for Y1, it is necessary for y2 to connect to the gate of PMOS transistor T1 and y3' to connect to the gate of PMOS transistor T2. Notice state variable y2 does not need to be inverted to generate y2', but y1 and y3 need inverters to generate y1' and y3'. The total number of transistors in the first SRL storage cell of FIG. 16 is 16.

Fault tolerant operation of the SRL storage cell of FIG. 16 functions as follows. Assume there are two SRL storage cells connected in a shift register configuration. Assume the first SRL storage cell is in state 010, and y1 assumes a fault to force the circuit to 110. The first SRL storage cell state value of 110 is passed to the second SRL storage cell which has a next state entry of 0ZZ, as shown in FIG. 17. The next state value of 0ZZ forces the second SRL storage cell to immediately return to 010. This action insures that a fault is not propagated, a critical feature in SRL.

Figure 18:
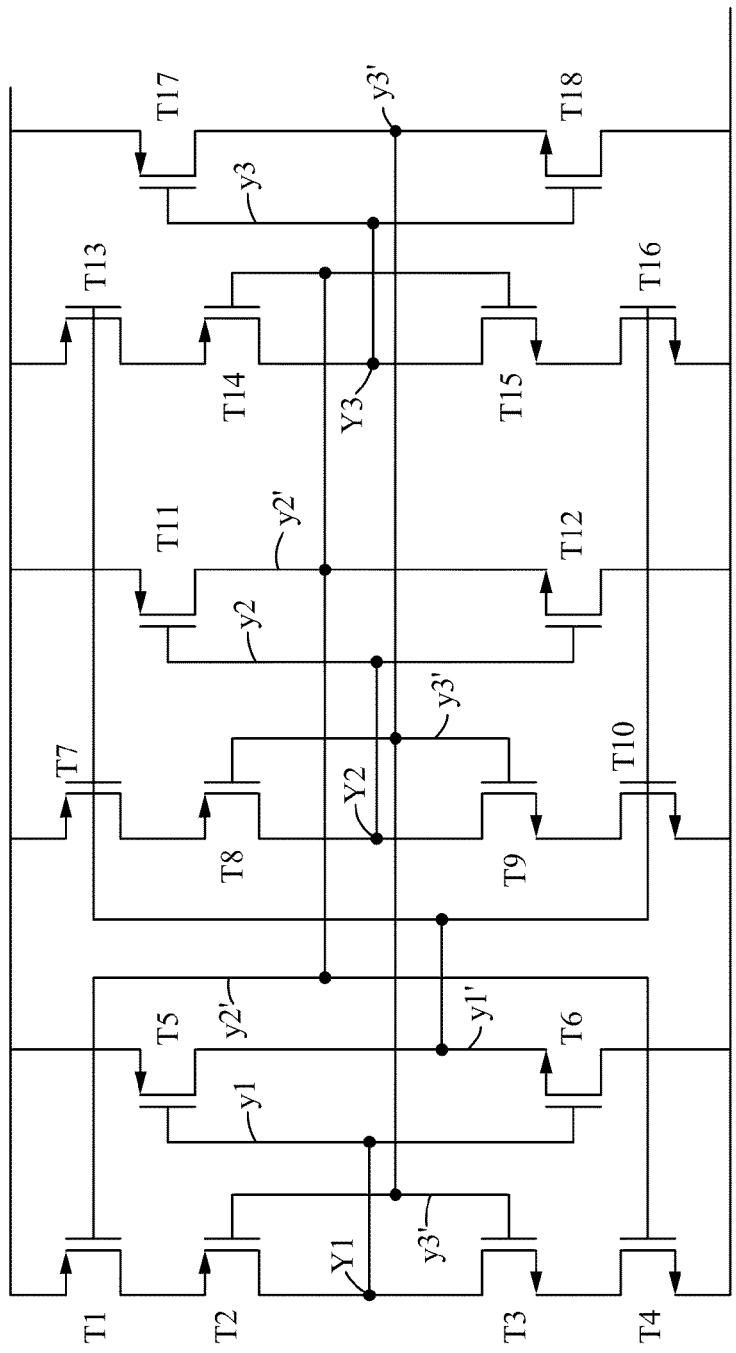
FIG. 18 illustrates a schematic diagram of an exemplary second SRL latch cell according to a second design.
Figure 19:
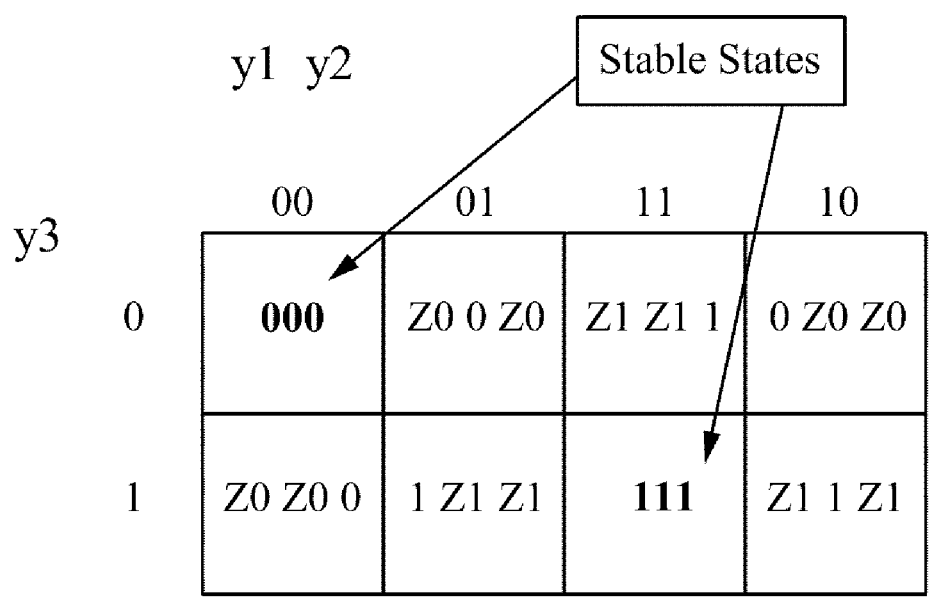
FIG. 19 illustrates a state transition table for the second SRL latch cell of FIG. 18.

Design 2:

FIG. 18 illustrates a schematic diagram of an exemplary second SRL storage cell according to a second design. The state transition table for the second SRL storage cell of FIG. 18 is shown in FIG. 19. In Design 2, the stable states are 000 and 111. Design 2 includes three inverters. The design equations for Design 2 are:

$$Y1 = y2y3(0) + y2'y3'(1)$$

$$Y2 = y1y3(0) + y1'y3'(1)$$

$$Y3 = y1y2(0) + y1'y2'(1) \tag{6}$$

A first inverter includes transistors T5 and T6 to generate y1'. A second inverter includes transistors T11 and T12 to generate y2'. A third inverter includes transistors T17 and T18 to generate y3'. The number of transistors to implement the second SRL storage cell of FIG. 18 is 18.

The above discussion demonstrates fault tolerance for transient faults, specifically SEU induced faults. Fault tolerance is also achieved in other transient faults, including noise that impacts at most one state variable in the SRL latches. It should be noted that multiple faults can be tolerated as long as only one of the three or more variables in a given SRL latch is affected. Finally, solid faults, where the fault does not go away with time, are also tolerated in this single fault tolerant system.

The fault tolerant circuit has been described in terms of specific embodiments incorporating details to facilitate the understanding of the principles of construction and operation of the fault tolerant circuit. Such references, herein, to specific embodiments and details thereof are not intended to limit the scope of the claims appended hereto. It will be apparent to those skilled in the art that modifications can be made in the embodiments chosen for illustration without departing from the spirit and scope of the fault tolerant circuit.

What is claimed is:

1. A network of cells which include data storage elements and combinational logic configured to tolerate transient and solid faults comprised of the following elements:
    a plurality of data storage cells each with the property to internally self recover from transient faults, wherein each data storage cell is configured to accept as input three signals of which a maximum of one is in error, to correct any single error input to correct the error on one of the input three signals, and to generate at least three outputs where at most only one output is in error due to a fault, further wherein each data storage cell has a plurality of state variables yk where k=1, 2, . . . , n and n is at least 3; and
    a plurality of combinational logic circuits coupled to the plurality of data storage cells such that each data storage cell output drives an independent combinational logic circuit,
    wherein the interconnection of elements is defined as follows: Let one or more data storage cells i each function as a data source and let data storage cell j function as a data sink,
        i. there are n combinational logic circuits coupled between data storage cell i and data storage cell j, one combinational logic circuit for each state variable yk;
        ii. for each state variable yk in data storage cell j, the combinational logic is derived only from one state variable yk in data storage cell i and presented as input to data storage cell j;
        iii. at most one combinational logic circuit can suffer from a fault;
    wherein the data storage cell j receives n input signals from n combinational logic circuits, each of the n input signals drive state variable nodes k, k=1, . . . , n, and the data storage cell j is configured to transition to a correct stable state when at most one of the n input signals presents a false value due to a transient fault.

2. The networks of cells in claim 1 wherein each data storage cell has the following properties:
    a. an asynchronous sequential circuit that models the behavior of the data storage cell;
    b. a minimum of three state variables required in the asynchronous sequential circuit model;
    c. a minimum of three state variable modules, each that implement one of the three state variables in the asynchronous sequential circuit model of the data storage cell;
    d. the three state variable modules are configured such that at most one state variable module is susceptible to a single fault condition at a time; and
    e. when the state variable module of one state variable is affected by a fault, the unaffected state variable module circuits activate the data storage cell to restore the affected variable; state variable modules unaffected by the fault are prevented from transitioning further.

3. The networks of cells in claim 2 wherein each data storage cell has the following properties:
    a. each state variable module comprises a plurality of PMOS transistors which when active drive the corresponding state variable to a high (logic 1) state and a plurality of NMOS transistors which when active drive the corresponding state variable to a low (logic 0) state;
    b. stable states for the state variables are 000 and 111;
    c. in a non-fault environment, either the PMOS or NMOS transistors are active to drive the state variables to the high or low state; and
    d. let the state variables be noted as yi, i=1, 2, 3. If a fault affects state variable yi, feedback within the data storage cell from state variable yj, j≠i, forces state variable yi to return to the correct state, and feedback within the data storage cell forces state variable yj, j≠i, into the high impedance state.

4. The networks of cells in claim 3 wherein each data storage cell has the following properties:
    a. three state variables Y1, Y2, Y3 where each state variable is defined by a circuit comprising a plurality of two series PMOS devices coupled to a supply voltage and two series NMOS devices coupled to ground;
    b. a junction between the PMOS and NMOS transistors is defined as a state variable output;
    c. three inverters generate complement state variable values;
    d. gates of the PMOS and the gates of the NMOS transistors in the circuit for state variable Yi, i=1, 2, 3, are driven by an output of the inverters from yj and yk, j, k≠i.

5. The networks of cells in claim 2 wherein each data storage cell has the following properties:
    a. each state variable module comprises a plurality of PMOS transistors which when active drive the corresponding state variable to a high (logic 1) state and a plurality of NMOS transistors which when active drive the corresponding state variable to a low (logic 0) state;
    b. stable states for the state variables have two variables 0 and one 1 or two variables 1 and one 0;
    c. in a non-fault environment, either the PMOS or NMOS transistors are active to drive the state variables to the high or low state; and
    d. let the state variables be noted as yi, i=1, 2, 3. If a fault affects state variable yi, feedback within the data storage cell from state variable yj, j≠i, forces state variable yi to return to the correct state, and feedback within the data storage cell forces state variable yj, j≠i, into the high impedance state.

6. The networks of cells in claim 5 wherein each data storage cell has the following properties:
    a. three state variables Y1, Y2, Y3 where each state variable is defined by a circuit comprising a plurality of two series PMOS devices coupled to a supply voltage and two series NMOS devices coupled to ground;
    b. a junction between the PMOS and NMOS transistors is defined as a state variable output;
    c. two inverters generate complement state variable values, wherein one inverter is driven by state variable y1 and the other inverter is driven by state variable y3;
    d. a gate of one PMOS and a gate of one NMOS transistor in the circuit for state variable Y2 are driven by state variable y1, and a gate of the other PMOS and a gate of the other NMOS transistor are driven by state variable y3;

e. a gate of one PMOS and a gate of one NMOS transistor in the circuit for state variable Y1 are driven by state variable y2, and a gate of the other PMOS and a gate of the other NMOS transistor are driven by the output from the inverter from state variable y3;

f. a gate of one PMOS and a gate of one NMOS transistor in the circuit for state variable Y3 are driven by state variable y2, and a gate of the other PMOS and a gate of the other NMOS transistor are driven by the output from the inverter from y1.

7. The networks of cells in claim 1 wherein each data storage cell is configured as a DICE cell with four state variables propagating state information.

8. The networks of cells in claim 1 wherein each data storage cell is configured as a DICE cell with three state variables propagating state information.

9. The networks of cells in claim 1 wherein each data storage cell is configured as a Dooley Barry cell with four state variables propagating state information.

10. The networks of cells in claim 1 wherein each data storage cell is configured as a Dooley Barry cell with three state variables propagating state information.

11. The networks of cells in claim 1 wherein each data storage cell is configured as a SERT cell with four state variables propagating state information.

12. The networks of cells in claim 1 wherein each data storage cell is configured as a SERT cell with three state variables propagating state information.

13. The network of cells in claim 1 further comprising a separate clock driver for each circuit that defines a separate state variable produces fault tolerance with a clock system for the network of cells.

14. The network of cells in claim 1 wherein each combinational logic circuit is comprised of combinational logic elements followed with a non-fault tolerant latch.

\* \* \* \* \*